(12) United States Patent
Chung

(10) Patent No.: US 6,653,201 B2
(45) Date of Patent: Nov. 25, 2003

(54) METHOD FOR FORMING AN ISOLATION REGION IN A SEMICONDUCTOR DEVICE

(75) Inventor: Yi Sun Chung, Chungchongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/247,531

(22) Filed: Sep. 20, 2002

(65) Prior Publication Data

US 2003/0054617 A1 Mar. 20, 2003

(30) Foreign Application Priority Data

Sep. 20, 2001 (KR) .................... P2001-58285

(51) Int. Cl.[7] .............. H01L 21/336; H01L 21/76; H01L 21/425
(52) U.S. Cl. ............... 438/424; 438/430; 438/296; 438/524
(58) Field of Search .................. 438/424, 430

(56) References Cited

U.S. PATENT DOCUMENTS 6,333,232 B1 * 12/2001 Kunikiyo

* cited by examiner

*Primary Examiner*—John F. Niebling
*Assistant Examiner*—Stanetta Isaac
(74) *Attorney, Agent, or Firm*—Birch, Stewart, Kolasch & Birch, LLP

(57) ABSTRACT

A method for forming an isolation region in a semiconductor device, in which nitrogen ions are injected into a region of an isolation oxide film to form an oxynitride film, thereby preventing formation of a recess at a top edge of the isolation oxide film, which improves the device isolation characteristic. The method includes depositing a pad oxide film and a pad nitride film over a substrate. The pad oxide film, the pad nitride film, and the substrate are selectively removed to form a trench, which is then filled with an isolation oxide film. Nitrogen ions are injected into an entire surface of the pad nitride film, inclusive of the isolation oxide film, to form an oxynitride film in a region of the isolation oxide film. The pad nitride film and the pad oxide film are removed, and a gate oxide film and a polysilicon layer are deposited.

14 Claims, 7 Drawing Sheets

METHOD FOR FORMING AN ISOLATION REGION IN A SEMICONDUCTOR DEVICE

This nonprovisional application claims priority under 35U.S.C. §119(a) on Patent Application No. 2001-0058285 filed in Korea on Sep. 20, 2001, which is herein incorporated by reference.

BACKGROUND OF THE INVENTION

1. Field of the Invention

The invention relates to a method for fabricating a semiconductor device having improved isolation characteristics, and more particularly, to a method for forming an isolation region in a semiconductor device, in which nitrogen ions are injected into a region of an isolation oxide film to form an oxynitride film that prevents formation of a recess at a top edge of the isolation oxide film.

2. Background of the Related Art

A related art method for forming an isolation region in a semiconductor device will be explained, with reference to the attached drawings. FIGS. 1A–1H illustrate sections showing the steps of a related art method for forming an isolation region in a semiconductor device.

Referring to FIGS. 1A, 1B, and 1C, a pad oxide film 12, and a pad nitride film 13 are successively deposited on a silicon substrate 11.

Referring to FIG. 1D, the pad nitride film 13, the pad oxide film 12, and the silicon substrate 11 are removed selectively, to form a trench. A process for isolating a region from another region (active region) on the substrate by selectively removing the substrate and the insulating film layer on the substrate to form a trench, and filling the trench with an oxide film, is referred to as STI (Shallow Trench Isolation).

Referring to FIG. 1E, an isolation oxide film 14 is deposited sufficient to fully fill the trench, and then subjected to CMP (Chemical Mechanical Polishing) to planarize at a height of a surface of the pad nitride film 13a.

Referring to FIG. 1F, the pad nitride film 13a, and the pad oxide film 12a on the substrate 11a are removed. As shown in FIG. 1G, an entire surface of the substrate 11a is cleaned with HF solution for removing the pad oxide film, a sacrificial oxide (not shown), and impurities on the substrate 11a. In general, the sacrificial oxide is mostly used in formation of the isolation region by STI, rather than LOCOS (Local Oxidation Of Silicon).

In the foregoing cleaning for removing the sacrificial oxide film, and the like, even the isolation oxide film 14a filling the trench is also etched, forming field recesses at upper edges of the isolation oxide film 14a, which interface with the active region. This is a major cause of deteriorating characteristics of the isolation region.

Referring to FIG. 1H, a gate oxide film 15, and a polysilicon layer 16 are successively formed on an entire surface of the substrate 11a, including the trench. The polysilicon layer 16 is patterned in a following process, for use as a gate electrode.

However, the foregoing method for forming an isolation region in a semiconductor device has the following problems.

First, the progression of process steps (deposition of a gate oxide film, formation of a gate electrode, and the like) with the field recesses remaining at the upper edges of the isolation oxide film tends to cause concentration of an electric field thereto after formation of a device, to cause malfunction of the device.

Second, at the junction, there is a tendency for an excessive flow of leakage current at the field recesses arising from deeper penetration of the implant dose through the field recesses.

Third, the excessive lateral growth of Salicide (Self Aligned Silicide) in the field recess regions substantially affects device characteristics.

Fourth, polysilicon or nitride spacers may be formed to eliminate the foregoing problems, but this results in additional deposition process steps, causing many problems in the subsequent process.

SUMMARY OF THE INVENTION

It is to be understood that both the foregoing general description and the following detailed description are exemplary and explanatory and are intended to provide further explanation of the invention as claimed.

Accordingly, the invention is directed to a method for forming an isolation region in a semiconductor device that substantially obviates one or more of the problems due to limitations and disadvantages of the related art.

An object of the invention, in part, is to provide a method for forming an isolation region in a semiconductor device, which can prevent formation of field recesses at upper edges of an isolation oxide film, for improving device isolation characteristics.

The invention, in part, pertains to a method for forming an isolation region in a semiconductor device includes the steps of (a) depositing a pad oxide film, and a pad nitride film on a substrate in succession, (b) selectively removing the pad oxide film, the pad nitride film, and the substrate, to form a trench, and filling the trench with an isolation oxide film, (c) injecting nitrogen ions into an entire surface of the pad nitride film, inclusive of the isolation oxide film, to form an oxynitride film in a region of the isolation oxide film, (d) removing the pad nitride film, and the pad oxide film, and (e) successively depositing a gate oxide film, and a polysilicon layer on the substrate.

The invention, in part, pertains to the step of filling the trench with an isolation oxide film in the step (b) including depositing the isolation oxide film sufficient to fully fill the trench, and planarizing the isolation oxide film to a height of a surface of the pad nitride film. The pad nitride film remaining after the formation of the trench serves as a mask for forming the oxynitride film during the injection of nitrogen ions.

The invention, in part, pertains to injecting the nitrogen ions to concentrate at a depth from a surface of the isolation oxide film in a range of about 300 Å to 500 Å during the formation of the oxynitride film. The nitrogen ions can be injected at an angle tilted in a range of about 0–45°, allowing the nitrogen ions to penetrate deeper at an interface of the active region and the isolation oxide film during the formation of the oxynitride film. The nitrogen ions can be injected at an energy of about 20 to 50 KeV and a dose of about $5\times10^{13}/cm^2$ to $8\times10^{15}/cm^2$. The nitrogen ion injection can be made at a step height of about 500 Å-1000 Å.

The invention, in part, pertains to stabilizing the oxynitride film by thermal annealing, which can be performed at a temperature range of about 800° C. to 1370° C. in a rapid thermal anneal carried out in a ramp type furnace for rapid temperature elevation. The annealing is performed for about 5 seconds to about 10 minutes.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the invention.

DETAILED DESCRIPTION OF THE PREFERRED EMBODIMENTS

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description FIGS. 2A–2I illustrate sections showing the steps of a method for forming an isolation region in a semiconductor device in accordance with a preferred embodiment of the present invention.

Figure 1A:
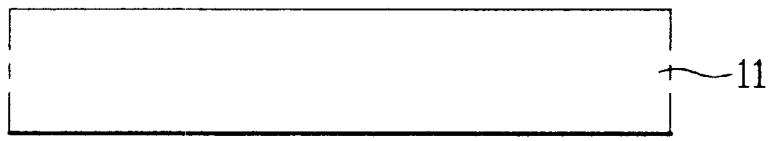
FIGS. 1A–1H illustrate sections showing the steps of a related art method for forming an isolation region in a semiconductor device.
Figure 1B:
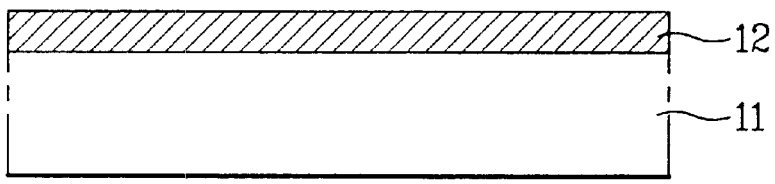
Figure 1C:
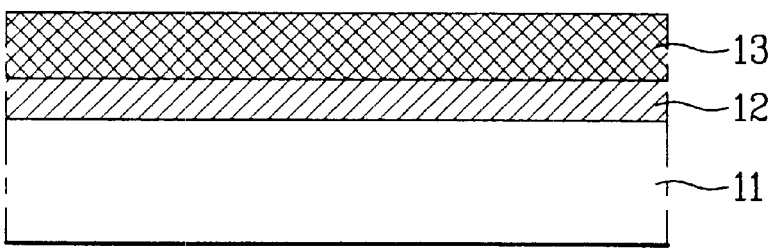
Figure 1D:
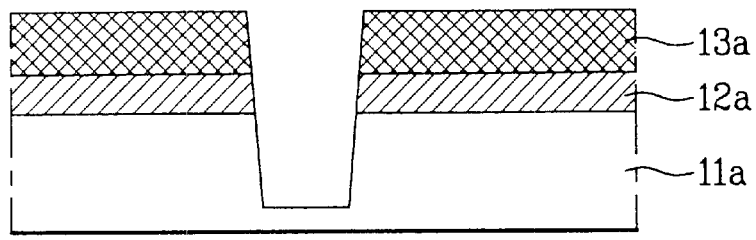
Figure 1E:
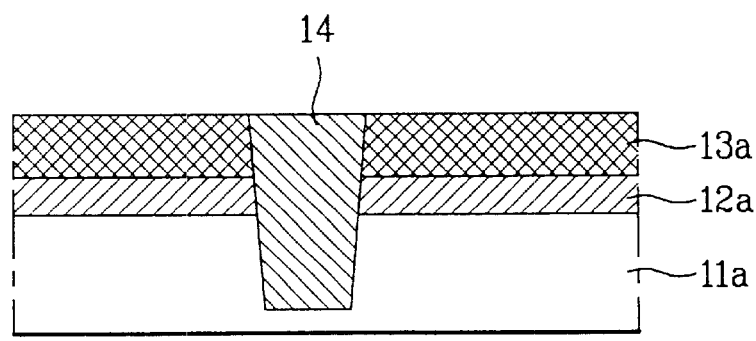
Figure 1F:
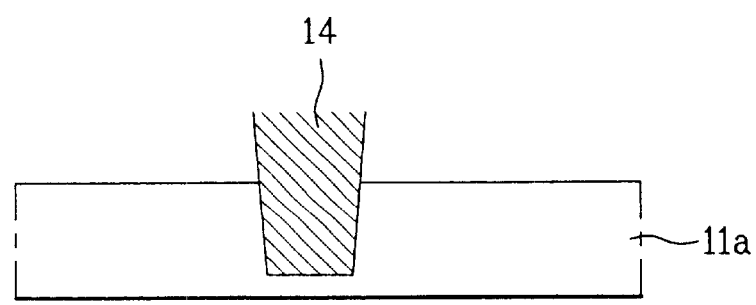
Figure 1G:
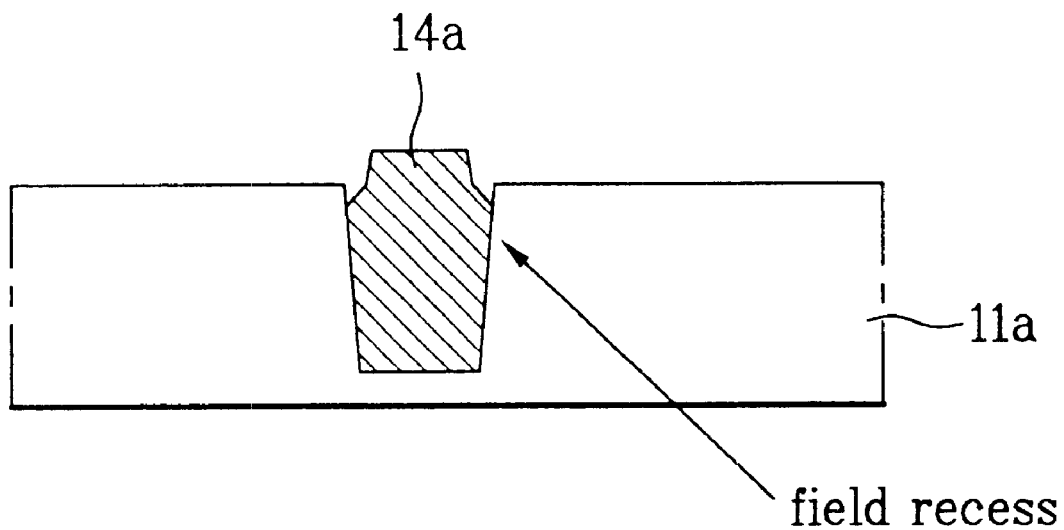
Figure 1H:
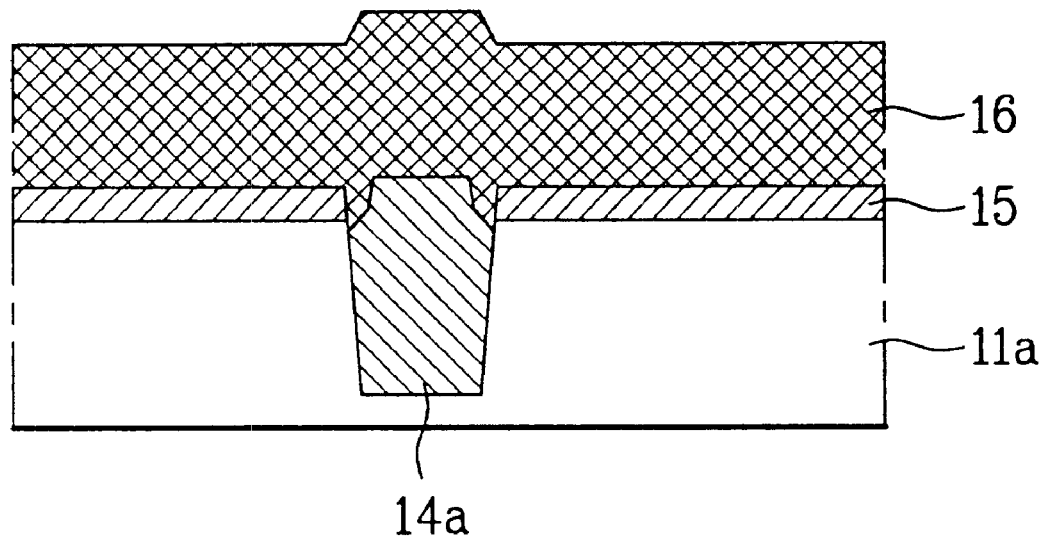
Figure 2A:
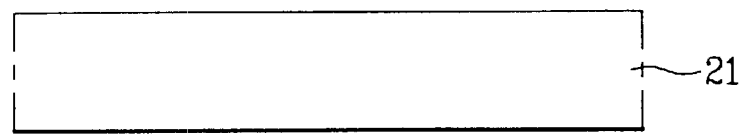
FIGS. 2A–2I illustrate sections showing the steps of a method for forming an isolation region in a semiconductor device in accordance with a preferred embodiment of the present invention.
Figure 2B:
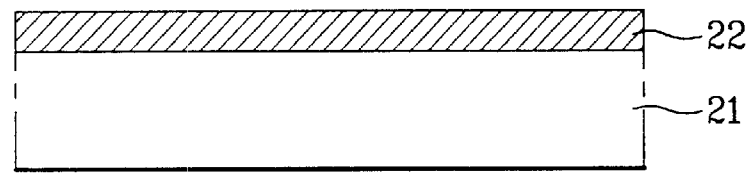
Figure 2C:
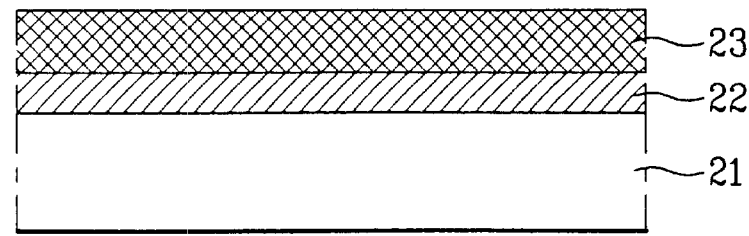
Figure 2D:
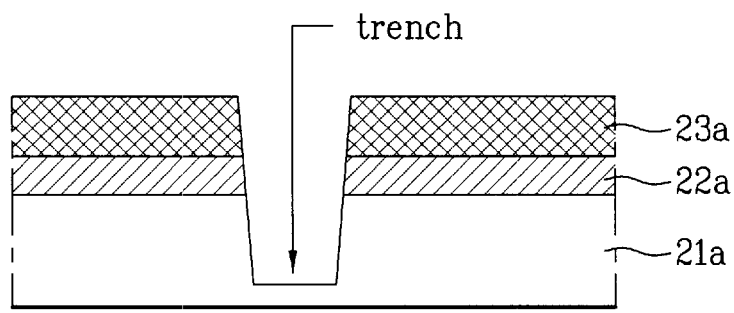

A pad oxide film 22 as shown in FIG. 2B, and a pad nitride film 23 as shown in FIG. 2C are formed in succession on a silicon substrate 21, as is shown in FIG. 2A. Referring to FIG. 2D, the pad nitride film 23, the pad oxide film 22, and the substrate 21 are selectively removed to form a trench.

Figure 2E:
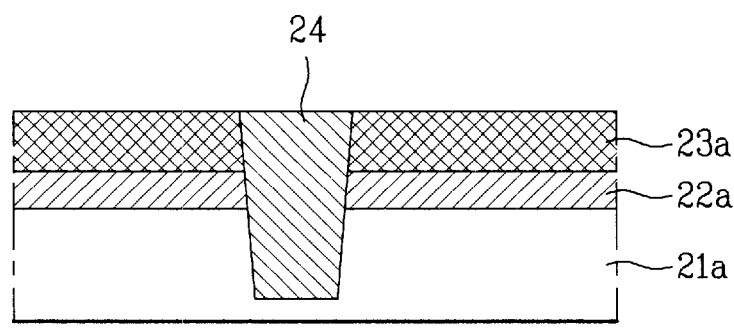

As shown in FIG. 2E, an oxide film is deposited on an entire surface of the substrate 21a sufficient to fully fill the trench. CMP planarizes a surface of the pad nitride film 23a, taking the surface as an end point. The region inside of the trench, which is filled with an oxide film, is called as an isolation region (i.e., a field region) in comparison to the other region (i.e., an active region) of the substrate, and the oxide film filling the isolation region is called an isolation oxide film 24.

Figure 2F:
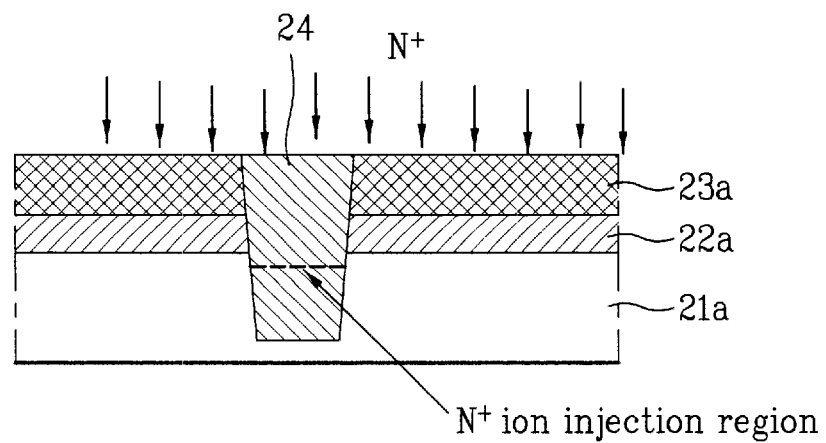

As shown in FIG. 2F, nitrogen ions are injected into an entire surface of the substrate 21a. In this instance, the pad nitride film 23a serves as a mask without being influenced from the nitrogen ion injection, to form an oxynitride film in a region of the isolation oxide film 24. Particularly, the oxynitride film is formed to be concentrated within about a 300 Å to 1000 Å range of depth from a surface of the isolation oxide film 24, by injecting the nitrogen ions at an approximately 500 Å to 1000 Å step height with about a 20 KeV to 50 KeV energy, and about a $5 \times 10^{13}/cm^2$ to $8 \times 10^{15}/cm^2$ dose.

Figure 2G:
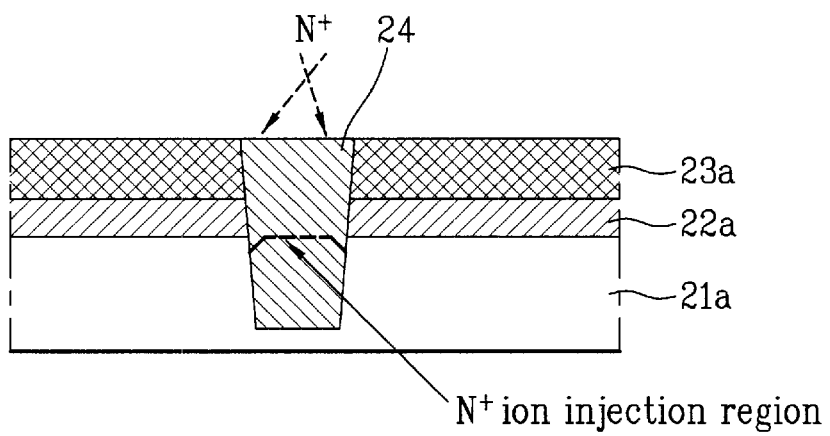

As shown in FIG. 2G, a tilted nitrogen ion injection is made, so that the nitrogen ions penetrate deeper at edge parts of the isolation region, for preventing an interface part with the active region from becoming weak. In this example, an angle of the tilt is about 0°–45°. Then, a RTA (Rapid Thermal Anneal) is conducted to stabilize the oxynitride film, which has an etch rate significantly lower than the isolation region only of $SiO_2$, to form almost no field recesses therein. The RTA is conducted at a temperature range of about 800° C. to 1370° C. in $N_2$, Ar, or $O_2$ atmosphere, for about 5 seconds to about 10 minutes in a fast ramp type furnace for a rapid temperature elevation.

Figure 3:
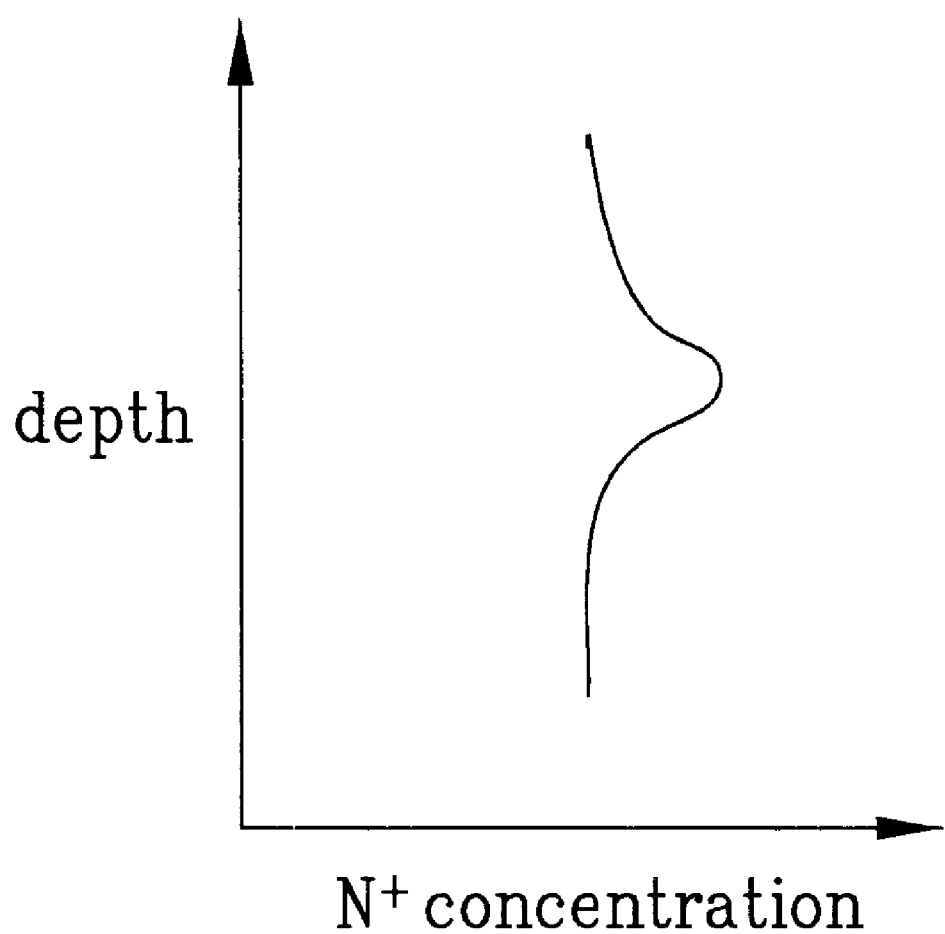
FIG. 3 illustrates a graph showing a depth from a surface of an isolation oxide film vs. a concentration of nitrogen ions during injection of nitride ions.

FIG. 3 illustrates a graph showing a depth from a surface of an isolation oxide film vs. a concentration of nitrogen ions during injection of nitride ions.

Referring to FIG. 3, during the nitrogen injection and the annealing, the ion injected nitrogen reacts with $SiO_2$ of the field oxide film, to form an oxynitride SiOxNy film that is deeper (concentration of the nitrogen ions is high) at an interface between the active region and the isolation region. During the annealing process, the nitrogen ions migrate to the interface of the active region and the isolation region, to suppress boron segregation that occurs after deposition of the polysilicon layer of the gate electrode at a later step, thereby preventing an occurrence of an unstable threshold voltage Vt.

Figure 2H:
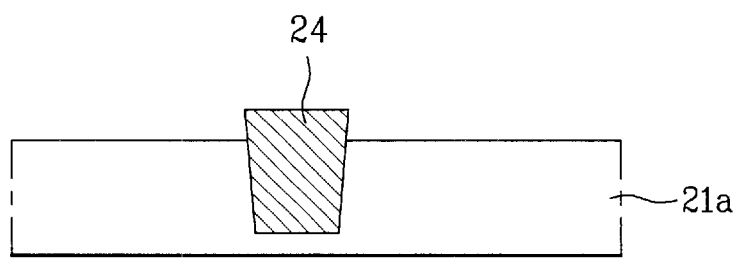

As shown in FIG. 2H, the pad nitride film 23a, and the pad oxide film 22a are precleaned. The oxynitride film can form an isolation region having an excellent trench profile because the oxynitride film has an etch rate in a HF cleaning solution that is much slower than a simple oxide film ($SiO_2$). This eliminates recesses in the isolation oxide film 24 in the subsequent pre-cleaning with HF for removal of impurities, such as for the sacrificial oxide film (not shown).

Figure 2I:
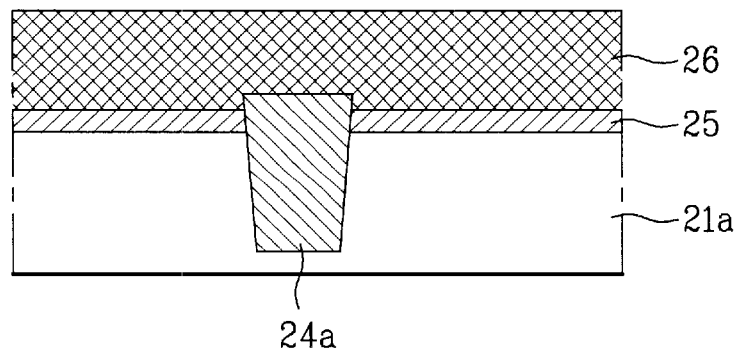

As shown in FIG. 2I, after a gate oxide film 25 is formed on the substrate 21a, inclusive of the trench, to a height lower than an upper part of the isolation oxide film 24, a polysilicon layer 26 is formed over an entire surface of the substrate 21a.

The formation of the isolation region without the recesses eliminates the problem of poly residue even after the etching when the polysilicon layer is gate patterned, and to form uniform salicide along an interface of the isolation region and the active region during the formation of the salicide (a silicide formed at parts where silicon is exposed, such as the gate region, the source/drain regions), which is a heat treating process.

As has been explained, the method for forming an isolation region in a semiconductor device has the following advantages.

First, nitrogen ion injection can be made without addition of masking, because the pad nitride film serves as a mask, preventing the nitrogen ion injection into the substrate, and forming the oxynitride in a region inside of the trench.

Second, the prevention of formation of the field recesses at upper edges of the isolation region allows an HF pre-clean in which impurities, such as sacrificial oxide film, are removed.

Third, the fabrication process efficiency can be increased in a following CMP (Chemical Mechanical Polishing).

Fourth, the etch efficiency can be improved when patterning the polysilicon into a gate electrode.

Fifth, the reduction of the field recess in the isolation oxide film, with less poly residue, can increase a poly etch margin.

Sixth, the reduction of the field recesses in the isolation oxide film permits formation of a uniform salicide during annealing of the polysilicon layer.

Seventh, boron segregation can be avoided during boron ion doping into a p-well region in formation of an NMOS.

Eighth, the reduction of the field recesses in the isolation oxide film can prevent concentration of an electric field, that in turn prevent drop of a threshold voltage, that stabilizes device characteristics.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A method for forming an isolation region in a semiconductor device, comprising the steps of:
   (a) successively depositing a pad oxide film, and a pad nitride film over a substrate;
   (b) selectively removing the pad oxide film, the pad nitride film, and the substrate, to form a trench, and filling the trench with an isolation oxide film;
   (c) injecting nitrogen ions into an entire surface of the pad nitride film, inclusive of the isolation oxide film, to form an oxynitride film in a region of the isolation oxide film, the injecting being a tilted injection;
   (d) removing the pad nitride film and the pad oxide film; and,
   (e) successively depositing a gate oxide film and a polysilicon layer on the substrate.

2. The method as claimed in claim 1, wherein the step of filling the trench with an isolation oxide film in the step (b) includes:
   depositing the isolation oxide film sufficient to fully fill the trench; and,
   planarizing the isolation oxide film to a height of a surface of the pad nitride film.

3. The method as claimed in claim 1, wherein the step (c) includes injecting the nitrogen ions to concentrate at a depth from a surface of the isolation oxide film in a range of about 300 Å to 500 Å during the formation of the oxynitride film.

4. The method as claimed in claim 1, wherein the tilted injection is performed at an angle in a range of about 0°–45°.

5. The method as claimed in claim 4, wherein the tilted injection makes the nitrogen ions penetrate deeper at an interface of the active region and the isolation oxide film during the formation of the oxynitride film.

6. The method as claimed in claim 3, wherein the nitrogen ion injection is made with an energy of about 20 KeV–50 KeV.

7. The method as claimed in claim 3, wherein the nitrogen ion injection is made with a dose of about $5\times10^{13}/cm^2$ to $8\times10^{15}/cm^2$.

8. The method as claimed in claim 3, wherein the nitrogen ion injection is made at a step height of about 500 Å–1000 Å.

9. The method as claimed in claim 1, further comprising annealing for stabilizing the oxynitride film, after the step (c).

10. The method as claimed in claim 9, wherein the annealing is RTA (Rapid Thermal Anneal) carried out in a fast ramp type furnace for a rapid temperature elevation.

11. The method as claimed in claim 10, wherein the annealing is conducted at a temperature ranging about 800° C. to 1370° C.

12. The method as claimed in claim 10, wherein the annealing is conducted in an atmosphere of $N_2$, Ar, or $O_2$.

13. The method as claimed in claim 10, wherein the annealing is conducted for about 5 seconds to about 10 minutes.

14. The method as claimed in claim 1, wherein the pad nitride film remaining after the formation of the trench in the step (b) serves as a mask for forming the oxynitride film in the step (c) at injection of the nitrogen ions.

* * * * *